(12) United States Patent
Patil et al.

(10) Patent No.: US 11,887,884 B2
(45) Date of Patent: Jan. 30, 2024

(54) PRE-LOADED BOWL MECHANISM FOR PROVIDING A SYMMETRIC RADIO FREQUENCY RETURN PATH

(71) Applicant: Applied Materials, Inc., Santa Clara, CA (US)

(72) Inventors: Ravikumar Patil, Karnataka (IN); Tuan A. Nguyen, San Jose, CA (US)

(73) Assignee: Applied Materials, Inc., Santa Clara, CA (US)

(*) Notice: Subject to any disclaimer, the term of this patent is extended or adjusted under 35 U.S.C. 154(b) by 249 days.

(21) Appl. No.: 17/072,790

(22) Filed: Oct. 16, 2020

(65) Prior Publication Data
US 2022/0122879 A1  Apr. 21, 2022

(51) Int. Cl.
*H01L 21/68*  (2006.01)
*H01L 21/687*  (2006.01)
(Continued)

(52) U.S. Cl.
CPC .. *H01L 21/68792* (2013.01); *H01J 37/32724* (2013.01); *H01L 21/67103* (2013.01);
(Continued)

(58) Field of Classification Search
CPC ......... H01L 21/68792; H01L 21/67103; H01L 21/67167; H01L 21/68742;
(Continued)

(56) References Cited

U.S. PATENT DOCUMENTS

2009/0178617 A1* 7/2009 White ............... H01J 37/32082
118/723 I
2019/0057841 A1* 2/2019 Collins ............... H01J 37/3244
(Continued)

FOREIGN PATENT DOCUMENTS

CN  101205605 B  6/2008
JP  2008-502135 A  1/2008
(Continued)

OTHER PUBLICATIONS

International Search Report and Written Opinion dated Feb. 7, 2022 in International Patent Application No. PCT/US2021/071883, 9 pages.

*Primary Examiner* — Mohammed Shamsuzzaman
(74) *Attorney, Agent, or Firm* — Kilpatrick Townsend & Stockton LLP

(57) ABSTRACT

Exemplary substrate processing systems may include a body that defines processing and transfer regions. The systems may include a liner atop the body. The systems may include a faceplate atop the liner. The systems may include a support within the body. The support may be vertically translatable between process and transfer positions. The support may include a plate having a heater. The support may include a shaft coupled with the plate. The support may include a bowl about the shaft below the plate. The bowl may be in alignment with the liner. The support may include springs that push the bowl upward as the support translates to the process position. The support may include straps that couple the plate and bowl. The support may include a hard stop. The bowl may contact the liner in the process position and may be spaced apart from the liner in the transfer position.

15 Claims, 10 Drawing Sheets

(51) Int. Cl.
*H01L 21/67* (2006.01)
*H01J 37/32* (2006.01)

(52) U.S. Cl.
CPC ............... *H01L 21/67167* (2013.01); *H01J 2237/20235* (2013.01)

(58) Field of Classification Search
CPC .......... H01L 21/68764; H01L 21/68771; H01J 37/32724; H01J 2237/20235
See application file for complete search history.

(56) References Cited

U.S. PATENT DOCUMENTS

2019/0360100 A1\* 11/2019 Nguyen ................ C23C 16/505
2022/0359171 A1\* 11/2022 Johanson ................ C23C 14/34

FOREIGN PATENT DOCUMENTS

| KR | 10-0789461 B1 | 1/2008 |
| TW | 202012688 A | 4/2020 |

\* cited by examiner

PRE-LOADED BOWL MECHANISM FOR PROVIDING A SYMMETRIC RADIO FREQUENCY RETURN PATH

TECHNICAL FIELD

The present technology relates to semiconductor processes and equipment. More specifically, the present technology relates to substrate processing systems and components.

BACKGROUND

Semiconductor processing systems often utilize cluster tools to integrate a number of process chambers together. This configuration may facilitate the performance of several sequential processing operations without removing the substrate from a controlled processing environment, or it may allow a similar process to be performed on multiple substrates at once in the varying chambers. These chambers may include, for example, degas chambers, pretreatment chambers, transfer chambers, chemical vapor deposition chambers, physical vapor deposition chambers, etch chambers, metrology chambers, and other chambers. The combination of chambers in a cluster tool, as well as the operating conditions and parameters under which these chambers are run, are selected to fabricate specific structures using particular process recipes and process flows.

Cluster tools often process a number of substrates by continuously passing substrates through a series of chambers and process operations. The process recipes and sequences will typically be programmed into a microprocessor controller that will direct, control, and monitor the processing of each substrate through the cluster tool. Once an entire cassette of wafers has been successfully processed through the cluster tool, the cassette may be passed to yet another cluster tool or stand-alone tool, such as a chemical mechanical polisher, for further processing.

Robots are typically used to transfer the wafers through the various processing and holding chambers. The amount of time required for each process and handling operation has a direct impact on the throughput of substrates per unit of time. Substrate throughput in a cluster tool may be directly related to the speed of the substrate handling robot positioned in a transfer chamber. As processing chamber configurations are further developed, conventional wafer transfer systems may be inadequate. Additionally, as cluster tools scale, component configurations may no longer adequately support processing or maintenance operations.

Thus, there is a need for improved systems and methods that can be used to efficiently direct substrates within cluster tool environments. These and other needs are addressed by the present technology.

SUMMARY

Exemplary substrate processing systems may include a chamber body that defines a processing region and a transfer region. The systems may include a liner positioned atop the chamber body. The systems may include a faceplate that is positioned atop the liner. The systems may include a substrate support disposed within the chamber body. The substrate support may be vertically translatable within the chamber body between a process position and a transfer position. The substrate support may include a support plate that includes a heater. The substrate support may include a shaft that is coupled with a bottom of the support plate. The substrate support may include a bowl disposed about the shaft and spaced a distance below the support plate. A peripheral edge of the bowl may be in vertical alignment with at least a portion of a bottom surface of the liner. The substrate support may include a plurality of springs that push the bowl upward as the substrate support is translated to the process position. The substrate support may include a plurality of metallic straps that couple a bottom of the support plate with the bowl. The substrate support may include at least one hard stop extending downward from a bottom of the support plate. A top surface of the peripheral edge of the bowl may contact the bottom surface of the liner when the substrate support is in the process position. The top surface of the peripheral edge of the bowl may be spaced apart from the bottom surface of the liner when the substrate support is in the transfer position.

In some embodiments, the systems may include a preload plate coupled with the bowl and slidably engaged about the shaft. The systems may include a bottom ring that is spaced vertically below the preload plate. The plurality of springs may be coupled with and extend between the preload plate and the bottom ring. Each of the plurality of springs may be in a compressed state when the substrate support is in the process position. Each of the plurality of springs may be in a generally relaxed state when the substrate support is in the transfer position. Each of the plurality of springs may be positioned about a respective one of a plurality of guide pins. The at least one hard stop may limit a vertical distance between the support plate and the bowl. The at least one hard stop may push the bowl downward as the substrate support is translated downward to the transfer position. The systems may include a pump liner disposed between the faceplate and the liner. Each of the plurality of metallic straps may be in a contracted state when the substrate support is in the transfer position. Each of the plurality of metallic straps may be in an extended state when the substrate support is in the process position. The systems may include a radio frequency source coupled with the substrate support. In the process position, a closed radio frequency circuit may be formed between the radio frequency source, the substrate support, the plurality of straps, the liner, and the faceplate.

Some embodiments of the present technology may also encompass substrate processing systems. The systems may include a chamber body that defines a processing region. The systems may include a liner positioned atop the chamber body. The systems may include a faceplate that is positioned atop the liner. The systems may include a substrate support disposed within the chamber body. The substrate support may be vertically translatable within the chamber body between a process position and a transfer position. The substrate support may include a support plate having a heater. The substrate support may include a shaft that is coupled with a bottom of the support plate. The substrate support may include a bowl disposed about the shaft and spaced a distance below the support plate. The substrate support may include a plurality of metallic straps that couple a bottom of the support plate with the bowl. The systems may include a hard stop coupled with the support plate that pushes the bowl downward as the substrate support is translated to the transfer position. The systems may include a coupling that pushes the bowl upward as the substrate support is translated to the process position. The bowl may contact the bottom surface of the liner when the substrate support is in the process position. The bowl may be spaced apart from the bottom surface of the liner when the substrate support is in the transfer position.

In some embodiments, the coupling may be expandable and contractible in a vertical direction. The coupling may include a preload plate coupled with the bowl and slidably engaged about the shaft. The coupling may include a bottom ring spaced vertically below the preload plate. The coupling may include a plurality of springs coupled with and extending between the preload plate and the bottom ring. Each of the plurality of springs may be in a compressed state when the substrate support is in the process position. Each of the plurality of springs may be in a generally relaxed state when the substrate support is in the transfer position. Each of the plurality of springs may be positioned about a respective one of a plurality of guide pins. The hard stop may limit a vertical distance between the support plate and the bowl. The systems may include a pump liner disposed between the faceplate and the liner. The systems may include a radio frequency source coupled with the substrate support. In the process position, a closed radio frequency circuit may be formed between the radio frequency source, the substrate support, the plurality of straps, the liner, and the faceplate.

Some embodiments of the present technology may also encompass methods of processing substrates. The methods may include moving a substrate support upward within a semiconductor processing chamber from a transfer position to a process position to engage a bowl of the substrate support with a liner of the semiconductor processing chamber. The substrate support may include a heater. The methods may include delivering one or more precursors to the semiconductor processing chamber. The methods may include supplying a radio frequency current to the heater via a radio frequency source.

In some embodiments, the substrate support may include a support plate and a plurality of metallic straps that couple a bottom of the support plate with the bowl. In the process position, a closed radio frequency circuit may be formed between the radio frequency source, the substrate support, the plurality of straps, the liner, and the faceplate.

Such technology may provide numerous benefits over conventional systems and techniques. For example, the processing systems may provide multi-substrate processing capabilities that may be scaled well beyond conventional designs. Additionally, each chamber system may include a dynamic radio frequency circuit that closes when the heater is in a process position and that opens when the heater is in a transfer position. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

Figure 1:
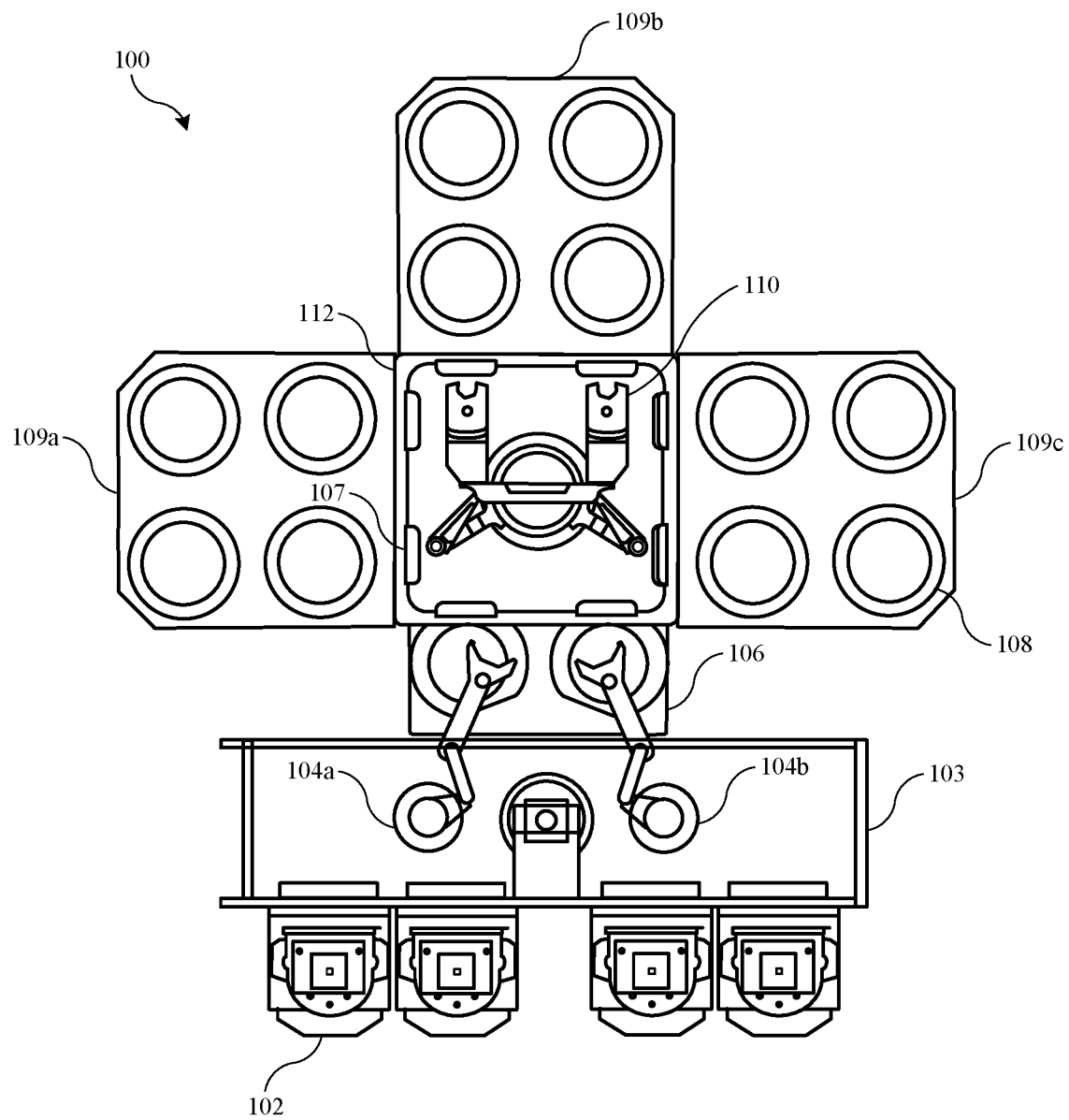
FIG. 1 shows a schematic top plan view of an exemplary processing system according to some embodiments of the present technology.

Several of the figures are included as schematics. It is to be understood that the figures are for illustrative purposes, and are not to be considered of scale or proportion unless specifically stated to be of scale or proportion. Additionally, as schematics, the figures are provided to aid comprehension and may not include all aspects or information compared to realistic representations, and may include exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

Substrate processing can include time-intensive operations for adding, removing, or otherwise modifying materials on a wafer or semiconductor substrate. Efficient movement of the substrate may reduce queue times and improve substrate throughput. To improve the number of substrates processed within a cluster tool, additional chambers may be incorporated onto the mainframe. Although transfer robots and processing chambers can be continually added by lengthening the tool, this may become space inefficient as the footprint of the cluster tool scales. Accordingly, the present technology may include cluster tools with an increased number of processing chambers within a defined footprint. To accommodate the limited footprint about transfer robots, the present technology may increase the number of processing chambers laterally outward from the robot. For example, some conventional cluster tools may include one or two processing chambers positioned about sections of a centrally located transfer robot to maximize the number of chambers radially about the robot. The present technology may expand on this concept by incorporating additional chambers laterally outward as another row or group of chambers. For example, the present technology may be applied with cluster tools including three, four, five, six, or more processing chambers accessible at each of one or more robot access positions.

However, as additional process locations are added, accessing these locations from a central robot may no longer be feasible without additional transfer capabilities at each location. Some conventional technologies may include wafer carriers on which the substrates remain seated during transition. However, wafer carriers may contribute to thermal non-uniformity and particle contamination on substrates. The present technology overcomes these issues by incorporating a transfer section vertically aligned with processing chamber regions and a carousel or transfer apparatus that may operate in concert with a central robot to access additional wafer positions. The present technology may not use conventional wafer carriers in some embodiments, and may transfer specific wafers from one substrate support to a different substrate support within the transfer region.

With shrinking nodes on the wafer, the variables that contribute to the on wafer performance increase. Variables contributing to on wafer radial uniformity may include the control of a radio frequency current for pedestal heaters and a design of supply/return path for radio frequency currents are some of variables. Isolation of a radio frequency supply and return in processing systems that include multiple chambers with a dedicated heater for each chamber is essential to avoid cross talk between chambers to individually control and improve the on wafer performance of each chamber, such as by independently tuning the plasma impedance by controlling radio frequency supply/return current of individual chamber. Additionally, by providing a symmetric radio frequency return path one can eliminate and/or minimize the radio frequency impact on the on wafer radial uniformity.

Conventional processing systems may achieve a symmetric radio frequency return path by arranging components in the radio frequency return path as concentric cylinders so that the radio frequency return current can be uniformly and symmetrically transferred back from the face plate to the radio frequency source. The radio frequency path may be made dynamic to enable the wafer transfer to and from a transfer apparatus. For example, a dynamic path may make the radio frequency circuit open and close based on the heater position. The radio frequency circuit may close when the heater is in a process position, which allows radio frequency return current to go back to the radio frequency source. The radio frequency circuit may remain open and radio frequency current will not flow when the heater is in a transfer position.

Some conventional processing systems utilize contact between a liner and a flexible baffle to open and close the radio frequency circuit. The baffle may be coupled with the heater such that when the heater is in the process position, the baffle is moved to an upward position and is in contact with a liner of the chamber. Contact between the liner and the baffle closes the radio frequency circuit by connecting the liner with the heater. When the heater is lowered to a transfer position, the baffle is lowered and brought out of contact with the liner, which opens the radio frequency circuit. While such baffle solutions generate a dynamic radio frequency path, the use of a baffle creates several problems. For example, due to relatively large surface area of the dynamic interface between the baffle and the liner, residual particles that remain on the liner plate from previous deposition operations may be released when the liner and baffle contact one another. While these particles may be downstream of the heater, the particles may still be deposited on the wafer, leading to diminished wafer performance. For example, many deposition operations may include a purge gas being supplied to the chamber from below the chamber. The flow of the purge gas may entrain the particles and deliver the particles onto the surface of the wafer.

Additional problems may arise due to the design of conventional bellows. For example, conventional bellows may by formed from stainless steel materials, which may react with various precursors, such as nitrogen trifluoride to form additional particles. Additionally, typical bellows are quite heavy, often weighing about 8 kg and being preassembled for installation in kits that weigh up to 18 kg. This makes installation and servicing difficult, often requiring multiple technicians.

To address these and other concerns, embodiments of the present technology may replace the baffle with a translatable bowl that engages with the liner to connect the heater with the liner. This connection provides a similar dynamic radio frequency circuit as provided by baffles while reducing the dynamic contact area that may contribute to particle generation. Additionally, the bowl may be considerably lighter than the bellows, which may make installation and service feasible for a single technician.

Although the remaining disclosure will routinely identify specific structures, such as four-position chamber systems, for which the present structures and methods may be employed, it will be readily understood that the systems and methods are equally applicable to any number of structures and devices that may benefit from the structural capabilities explained. Accordingly, the technology should not be considered to be so limited as for use with any particular structures alone. Moreover, although an exemplary tool system will be described to provide foundation for the present technology, it is to be understood that the present technology can be incorporated with any number of semiconductor processing chambers and tools that may benefit from some or all of the operations and systems to be described.

FIG. 1 shows a top plan view of one embodiment of a substrate processing tool or processing system 100 of deposition, etching, baking, and curing chambers according to some embodiments of the present technology. In the figure, a set of front-opening unified pods 102 supply substrates of a variety of sizes that are received within a factory interface 103 by robotic arms 104a and 104b and placed into a load lock or low pressure holding area 106 before being delivered to one of the substrate processing regions 108, positioned in chamber systems or quad sections 109a-c, which may each be a substrate processing system having a transfer region fluidly coupled with a plurality of processing regions 108. Although a quad system is illustrated, it is to be understood that platforms incorporating standalone chambers, twin chambers, and other multiple chamber systems are equally encompassed by the present technology. A second robotic arm 110 housed in a transfer chamber 112 may be used to transport the substrate wafers from the holding area 106 to the quad sections 109 and back, and second robotic arm 110 may be housed in a transfer chamber with which each of the quad sections or processing systems may be connected. Each substrate processing region 108 can be outfitted to perform a number of substrate processing operations including any number of deposition processes including cyclical layer deposition, atomic layer deposition, chemical vapor deposition, physical vapor deposition, as well as etch, preclean, anneal, plasma processing, degas, orientation, and other substrate processes.

Each quad section 109 may include a transfer region that may receive substrates from, and deliver substrates to, second robotic arm 110. The transfer region of the chamber system may be aligned with the transfer chamber having the second robotic arm 110. In some embodiments the transfer region may be laterally accessible to the robot. In subsequent operations, components of the transfer sections may vertically translate the substrates into the overlying processing regions 108. Similarly, the transfer regions may also be operable to rotate substrates between positions within each transfer region. The substrate processing regions 108 may include any number of system components for depositing, annealing, curing and/or etching a material film on the substrate or wafer. In one configuration, two sets of the processing regions, such as the processing regions in quad section 109a and 109b, may be used to deposit material on the substrate, and the third set of processing chambers, such as the processing chambers or regions in quad section 109c, may be used to cure, anneal, or treat the deposited films. In another configuration, all three sets of chambers, such as all twelve chambers illustrated, may be configured to both deposit and/or cure a film on the substrate.

As illustrated in the figure, second robotic arm 110 may include two arms for delivering and/or retrieving multiple substrates simultaneously. For example, each quad section 109 may include two accesses 107 along a surface of a housing of the transfer region, which may be laterally aligned with the second robotic arm. The accesses may be defined along a surface adjacent the transfer chamber 112. In some embodiments, such as illustrated, the first access may be aligned with a first substrate support of the plurality of substrate supports of a quad section. Additionally, the second access may be aligned with a second substrate support of the plurality of substrate supports of the quad section. The first substrate support may be adjacent to the second substrate support, and the two substrate supports may define a first row of substrate supports in some embodiments. As shown in the illustrated configuration, a second row of substrate supports may be positioned behind the first row of substrate supports laterally outward from the transfer chamber 112. The two arms of the second robotic arm 110 may be spaced to allow the two arms to simultaneously enter a quad section or chamber system to deliver or retrieve one or two substrates to substrate supports within the transfer region.

Any one or more of the transfer regions described may be incorporated with additional chambers separated from the fabrication system shown in different embodiments. It will be appreciated that additional configurations of deposition, etching, annealing, and curing chambers for material films are contemplated by processing system 100. Additionally, any number of other processing systems may be utilized with the present technology, which may incorporate transfer systems for performing any of the specific operations, such as the substrate movement. In some embodiments, processing systems that may provide access to multiple processing chamber regions while maintaining a vacuum environment in various sections, such as the noted holding and transfer areas, may allow operations to be performed in multiple chambers while maintaining a particular vacuum environment between discrete processes.

Figure 2:
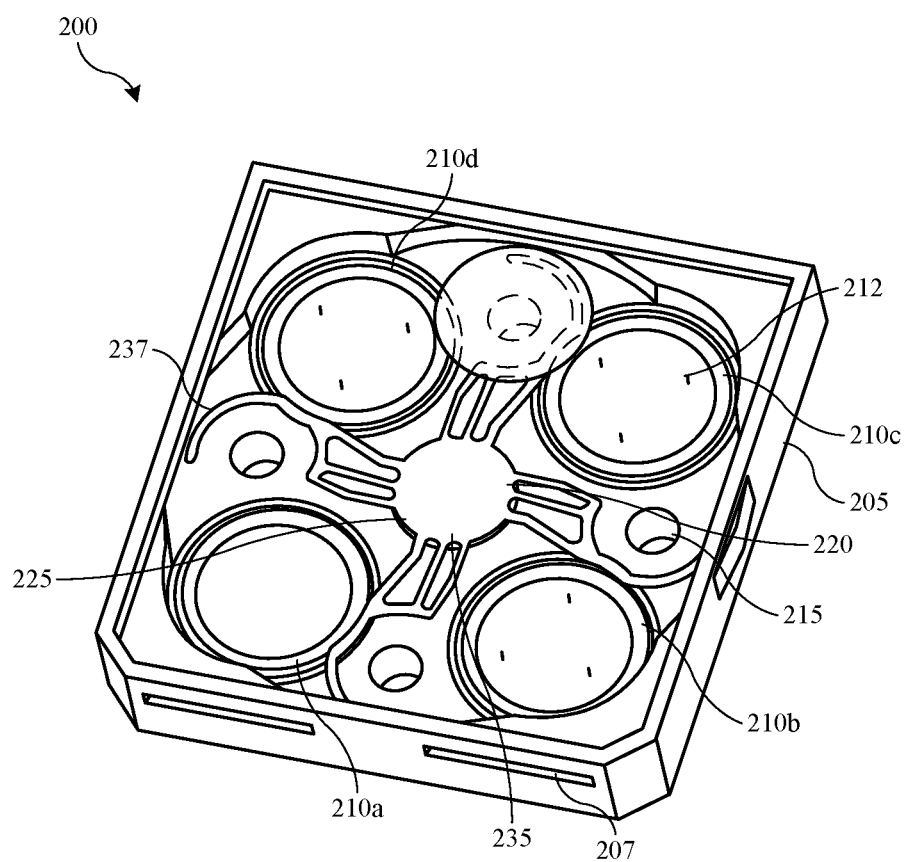
FIG. 2 shows a schematic isometric view of a transfer region of an exemplary chamber system according to some embodiments of the present technology.

As noted, processing system 100, or more specifically quad sections or chamber systems incorporated with processing system 100 or other processing systems, may include transfer sections positioned below the processing chamber regions illustrated. FIG. 2 shows a schematic isometric view of a transfer section of an exemplary chamber system 200 according to some embodiments of the present technology. FIG. 2 may illustrate additional aspects or variations of aspects of the transfer region described above, and may include any of the components or characteristics described. The system illustrated may include a transfer region housing 205, which may be a chamber body as discussed further below, defining a transfer region in which a number of components may be included. The transfer region may additionally be at least partially defined from above by processing chambers or processing regions fluidly coupled with the transfer region, such as processing chamber regions 108 illustrated in quad sections 109 of FIG. 1. A sidewall of the transfer region housing may define one or more access locations 207 through which substrates may be delivered and retrieved, such as by second robotic arm 110 as discussed above. Access locations 207 may be slit valves or other sealable access positions, which include doors or other sealing mechanisms to provide a hermetic environment within transfer region housing 205 in some embodiments. Although illustrated with two such access locations 207, it is to be understood that in some embodiments only a single access location 207 may be included, as well as access locations on multiple sides of the transfer region housing. It is also to be understood that the transfer section illustrated may be sized to accommodate any substrate size, including 200 mm, 300 mm, 450 mm, or larger or smaller substrates, including substrates characterized by any number of geometries or shapes.

Within transfer region housing 205 may be a plurality of substrate supports 210 positioned about the transfer region volume. Although four substrate supports are illustrated, it is to be understood that any number of substrate supports are similarly encompassed by embodiments of the present technology. For example, greater than or about three, four, five, six, eight, or more substrate supports 210 may be accommodated in transfer regions according to embodiments of the present technology. Second robotic arm 110 may deliver a substrate to either or both of substrate supports 210a or 210b through the accesses 207. Similarly, second robotic arm 110 may retrieve substrates from these locations. Lift pins 212 may protrude from the substrate supports 210, and may allow the robot to access beneath the substrates. The lift pins may be fixed on the substrate supports, or at a location where the substrate supports may recess below, or the lift pins may additionally be raised or lowered through the substrate supports in some embodiments. Substrate supports 210 may be vertically translatable, and in some embodiments may extend up to processing chamber regions of the substrate processing systems, such as processing chamber regions 108, positioned above the transfer region housing 205.

The transfer region housing 205 may provide access 215 for alignment systems, which may include an aligner that can extend through an aperture of the transfer region housing as illustrated and may operate in conjunction with a laser, camera, or other monitoring device protruding or transmitting through an adjacent aperture, and that may determine whether a substrate being translated is properly aligned. Transfer region housing 205 may also include a transfer apparatus 220 that may be operated in a number of ways to position substrates and move substrates between the various substrate supports. In one example, transfer apparatus 220 may move substrates on substrate supports 210a and 210b to substrate supports 210c and 210d, which may allow additional substrates to be delivered into the transfer chamber. Additional transfer operations may include rotating substrates between substrate supports for additional processing in overlying processing regions.

Transfer apparatus 220 may include a central hub 225 that may include one or more shafts extending into the transfer chamber. Coupled with the shaft may be an end effector 235. End effector 235 may include a plurality of arms 237 extending radially or laterally outward from the central hub. Although illustrated with a central body from which the arms extend, the end effector may additionally include separate arms that are each coupled with the shaft or central hub in various embodiments. Any number of arms may be included in embodiments of the present technology. In some embodiments a number of arms 237 may be similar or equal to the number of substrate supports 210 included in the chamber. Hence, as illustrated, for four substrate supports, transfer apparatus 220 may include four arms extending from the end effector. The arms may be characterized by any number of shapes and profiles, such as straight profiles or arcuate profiles, as well as including any number of distal profiles including hooks, rings, forks, or other designs for supporting a substrate and/or providing access to a substrate, such as for alignment or engagement.

The end effector 235, or components or portions of the end effector, may be used to contact substrates during transfer or movement. These components as well as the end effector may be made from or include a number of materials including conductive and/or insulative materials. The materials may be coated or plated in some embodiments to withstand contact with precursors or other chemicals that may pass into the transfer chamber from an overlying processing chamber.

Additionally, the materials may be provided or selected to withstand other environmental characteristics, such as temperature. In some embodiments, the substrate supports may be operable to heat a substrate disposed on the support. The substrate supports may be configured to increase a surface or substrate temperature to temperatures greater than or about 100° C., greater than or about 200° C., greater than or about 300° C., greater than or about 400° C., greater than or about 500° C., greater than or about 600° C., greater than or about 700° C., greater than or about 800° C., or higher. Any of these temperatures may be maintained during operations, and thus components of the transfer apparatus 220 may be exposed to any of these stated or encompassed temperatures. Consequently, in some embodiments any of the materials may be selected to accommodate these temperature regimes, and may include materials such as ceramics and metals that may be characterized by relatively low coefficients of thermal expansion, or other beneficial characteristics.

Component couplings may also be adapted for operation in high temperature and/or corrosive environments. For example, where end effectors and end portions are each ceramic, the coupling may include press fittings, snap fittings, or other fittings that may not include additional materials, such as bolts, which may expand and contract with temperature, and may cause cracking in the ceramics. In some embodiments the end portions may be continuous with the end effectors, and may be monolithically formed with the end effectors. Any number of other materials may be utilized that may facilitate operation or resistance during operation, and are similarly encompassed by the present technology. The transfer apparatus 220 may include a number of components and configurations that may facilitate the movement of the end effector in multiple directions, which may facilitate rotational movement, as well as vertical movement, or lateral movement in one or more ways with the drive system components to which the end effector may be coupled.

Figure 3:
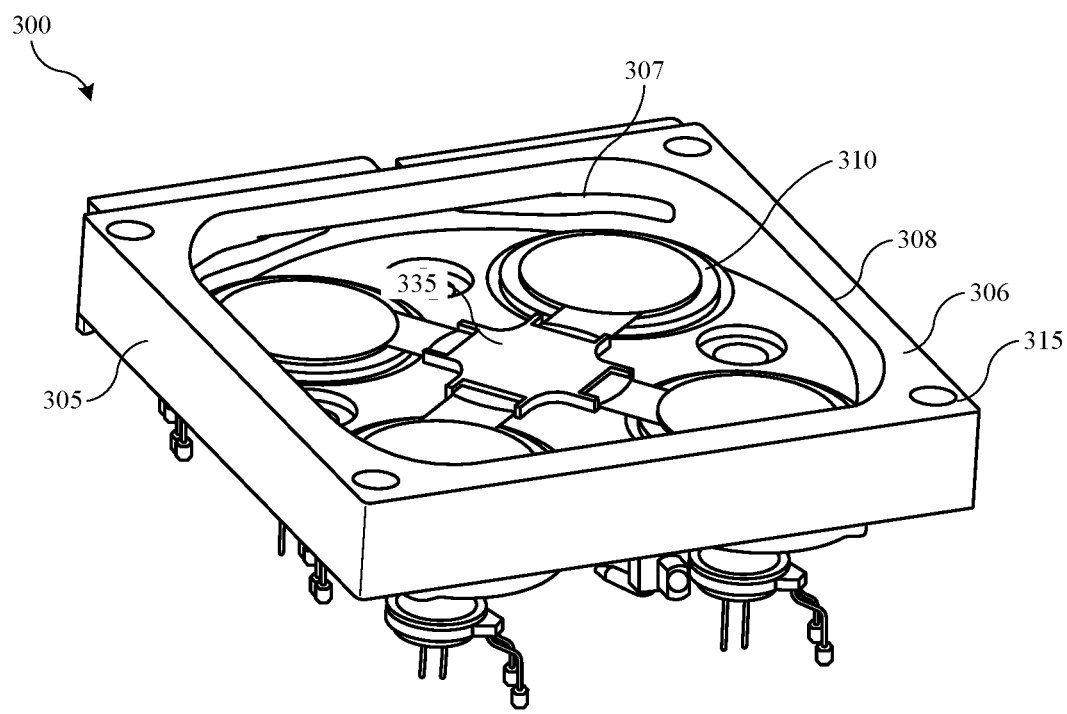
FIG. 3 shows a schematic isometric view of a transfer region of an exemplary chamber system according to some embodiments of the present technology.

FIG. 3 shows a schematic isometric view of a transfer region of a chamber system 300 of an exemplary chamber system according to some embodiments of the present technology. Chamber system 300 may be similar to the transfer region of chamber system 200 described above, and may include similar components including any of the components, characteristics, or configurations described above. FIG. 3 may also illustrate certain component couplings encompassed by the present technology along with the following figures.

Chamber system 300 may include a chamber body 305 or housing defining the transfer region. Within the defined volume may be a plurality of substrate supports 310 distributed about the chamber body as previously described. As will be described further below, each substrate support 310 may be vertically translatable along a central axis of the substrate support between a first position illustrated in the figure, and a second position where substrate processing may be performed. Chamber body 305 may also define one or more accesses 307 through the chamber body. A transfer apparatus 335 may be positioned within the transfer region and be configured to engage and rotate substrates among the substrate supports 310 within the transfer region as previously described. For example, transfer apparatus 335 may be rotatable about a central axis of the transfer apparatus to reposition substrates. The transfer apparatus 335 may also be laterally translatable in some embodiments to further facilitate repositioning substrates at each substrate support.

Chamber body 305 may include a top surface 306, which may provide support for overlying components of the system. Top surface 306 may define a gasket groove 308, which may provide seating for a gasket to provide hermetic sealing of overlying components for vacuum processing. Unlike some conventional systems, chamber system 300, and other chamber systems according to some embodiments of the present technology, may include an open transfer region within the processing chamber, and processing regions may be formed overlying the transfer region. Because of transfer apparatus 335 creating an area of sweep, supports or structure for separating processing regions may not be available. Consequently, the present technology may utilize overlying lid structures to form segregated processing regions overlying the open transfer region as will be described below. Hence, in some embodiments sealing between the chamber body and an overlying component may only occur about an outer chamber body wall defining the transfer region, and interior coupling may not be present in some embodiments. Chamber body 305 may also define apertures 315, which may facilitate exhaust flow from the processing regions of the overlying structures. Top surface 306 of chamber body 305 may also define one or more gasket grooves about the apertures 315 for sealing with an overlying component. Additionally, the apertures may provide locating features that may facilitate stacking of components in some embodiments.

Figure 4:
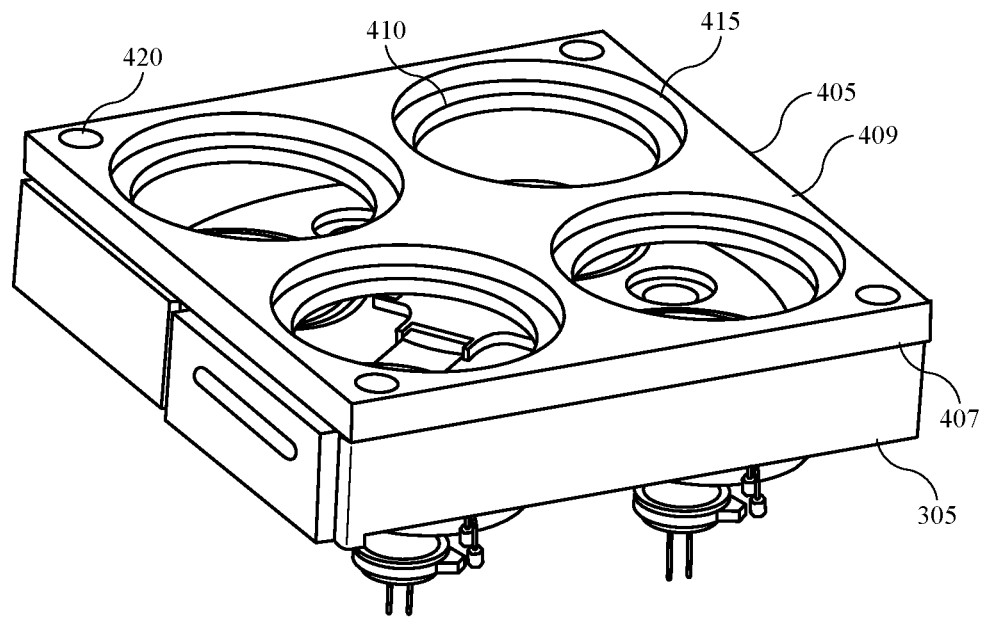
FIG. 4 shows a schematic isometric view of a transfer region of an exemplary chamber system according to some embodiments of the present technology.

FIG. 4 shows a schematic isometric view of overlying structures of chamber system 300 according to some embodiments of the present technology. For example, in some embodiments a first lid plate 405 may be seated on chamber body 305. First lid plate 405 may by characterized by a first surface 407 and a second surface 409 opposite the first surface. First surface 407 of the first lid plate 405 may contact chamber body 305, and may define companion grooves to cooperate with grooves 308 discussed above to produce a gasket channel between the components. First lid plate 405 may also define apertures 410, which may provide separation of overlying regions of the transfer chamber to form processing regions for substrate processing.

Apertures 410 may be defined through first lid plate 405, and may be at least partially aligned with substrate supports in the transfer region. In some embodiments, a number of apertures 410 may equal a number of substrate supports in the transfer region, and each aperture 410 may be axially aligned with a substrate support of the plurality of substrate supports. As will be described further below, the processing regions may be at least partially defined by the substrate supports when vertically raised to a second position within the chamber systems. The substrate supports may extend through the apertures 410 of the first lid plate 405. Accordingly, in some embodiments apertures 410 of the first lid plate 405 may be characterized by a diameter greater than a diameter of an associated substrate support. Depending on an amount of clearance, the diameter may be less than or about 25% greater than a diameter of a substrate support, and in some embodiments may be less than or about 20% greater, less than or about 15% greater, less than or about 10% greater, less than or about 9% greater, less than or about 8% greater, less than or about 7% greater, less than or about 6% greater, less than or about 5% greater, less than or about 4% greater, less than or about 3% greater, less than or about 2% greater, less than or about 1% greater than a diameter of a substrate support, or less, which may provide a minimum gap distance between the substrate support and the apertures 410.

First lid plate 405 may also include a second surface 409 opposite first surface 407. Second surface 409 may define a recessed ledge 415, which may produce an annular recessed shelf through the second surface 409 of first lid plate 405. Recessed ledges 415 may be defined about each aperture of the plurality of apertures 410 in some embodiments. The recessed shelf may provide support for lid stack components as will be described further below. Additionally, first lid plate 405 may define second apertures 420, which may at least partially define pumping channels from overlying components described below. Second apertures 420 may be axially aligned with apertures 315 of the chamber body 305 described previously.

Figure 5:
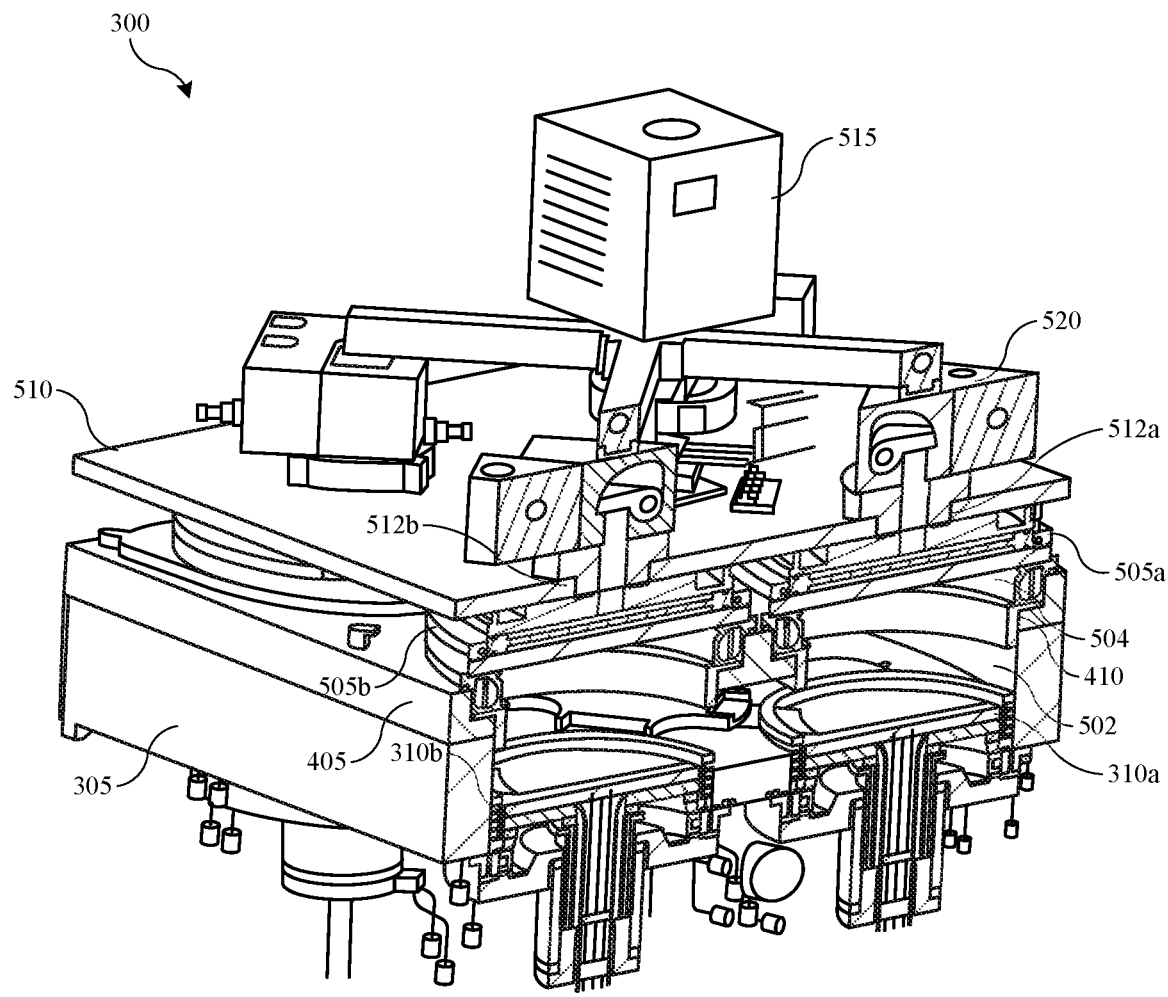
FIG. 5 shows a schematic partial isometric view of a chamber system according to some embodiments of the present technology.

FIG. 5 shows a schematic partial isometric view of chamber system 300 according to some embodiments of the present technology. The figure may illustrate a partial cross-section through two processing regions and a portion of a transfer region of the chamber system. For example, chamber system 300 may be a quad section of processing system 100 described previously, and may include any of the components of any of the previously described components or systems.

Chamber system 300, as developed through the figure, may include a chamber body 305 defining a transfer region 502 including substrate supports 310, which may extend into the chamber body 305 and be vertically translatable as previously described. First lid plate 405 may be seated overlying the chamber body 305, and may define apertures 410 producing access for processing region 504 to be formed with additional chamber system components. Seated about or at least partially within each aperture may be a lid stack 505, and chamber system 300 may include a plurality of lid stacks 505, including a number of lid stacks equal to a number of apertures 410 of the plurality of apertures. Each lid stack 505 may be seated on the first lid plate 405, and may be seated on a shelf produced by recessed ledges through the second surface of the first lid plate. The lid stacks 505 may at least partially define processing regions 504 of the chamber system 300.

As illustrated, processing regions 504 may be vertically offset from the transfer region 502, but may be fluidly coupled with the transfer region. Additionally, the processing regions may be separated from the other processing regions. Although the processing regions may be fluidly coupled with other processing regions through the transfer region from below, the processing regions may be fluidly isolated, from above, from each of the other processing regions. Each lid stack 505 may also be aligned with a substrate support in some embodiments. For example, as illustrated, lid stack 505*a* may be aligned over substrate support 310*a*, and lid stack 505*b* may be aligned over substrate support 310*b*. When raised to operational positions, such as a second position, the substrates may deliver substrates for individual processing within the separate processing regions. When in this position, as will be described further below, each processing region 504 may be at least partially defined from below by an associated substrate support in the second position.

FIG. 5 also illustrates embodiments in which a second lid plate 510 may be included for the chamber system. Second lid plate 510 may be coupled with each of the lid stacks, which may be positioned between the first lid plate 405 and the second lid plate 510 in some embodiments. As will be explained below, the second lid plate 510 may facilitate accessing components of the lid stacks 505. Second lid plate 510 may define a plurality of apertures 512 through the second lid plate. Each aperture of the plurality of apertures may be defined to provide fluid access to a specific lid stack 505 or processing region 504. A remote plasma unit 515 may optionally be included in chamber system 300 in some embodiments, and may be supported on second lid plate 510. In some embodiments, remote plasma unit 515 may be fluidly coupled with each aperture 512 of the plurality of apertures through second lid plate 510. Isolation valves 520 may be included along each fluid line to provide fluid control to each individual processing region 504. For example, as illustrated, aperture 512*a* may provide fluid access to lid stack 505*a*. Aperture 512*a* may also be axially aligned with any of the lid stack components, as well as with substrate support 310*a* in some embodiments, which may produce an axial alignment for each of the components associated with individual processing regions, such as along a central axis through the substrate support or any of the components associated with a particular processing region 504. Similarly, aperture 512*b* may provide fluid access to lid stack 505*b*, and may be aligned, including axially aligned with components of the lid stack as well as substrate support 310*b* in some embodiments.

Figure 6:
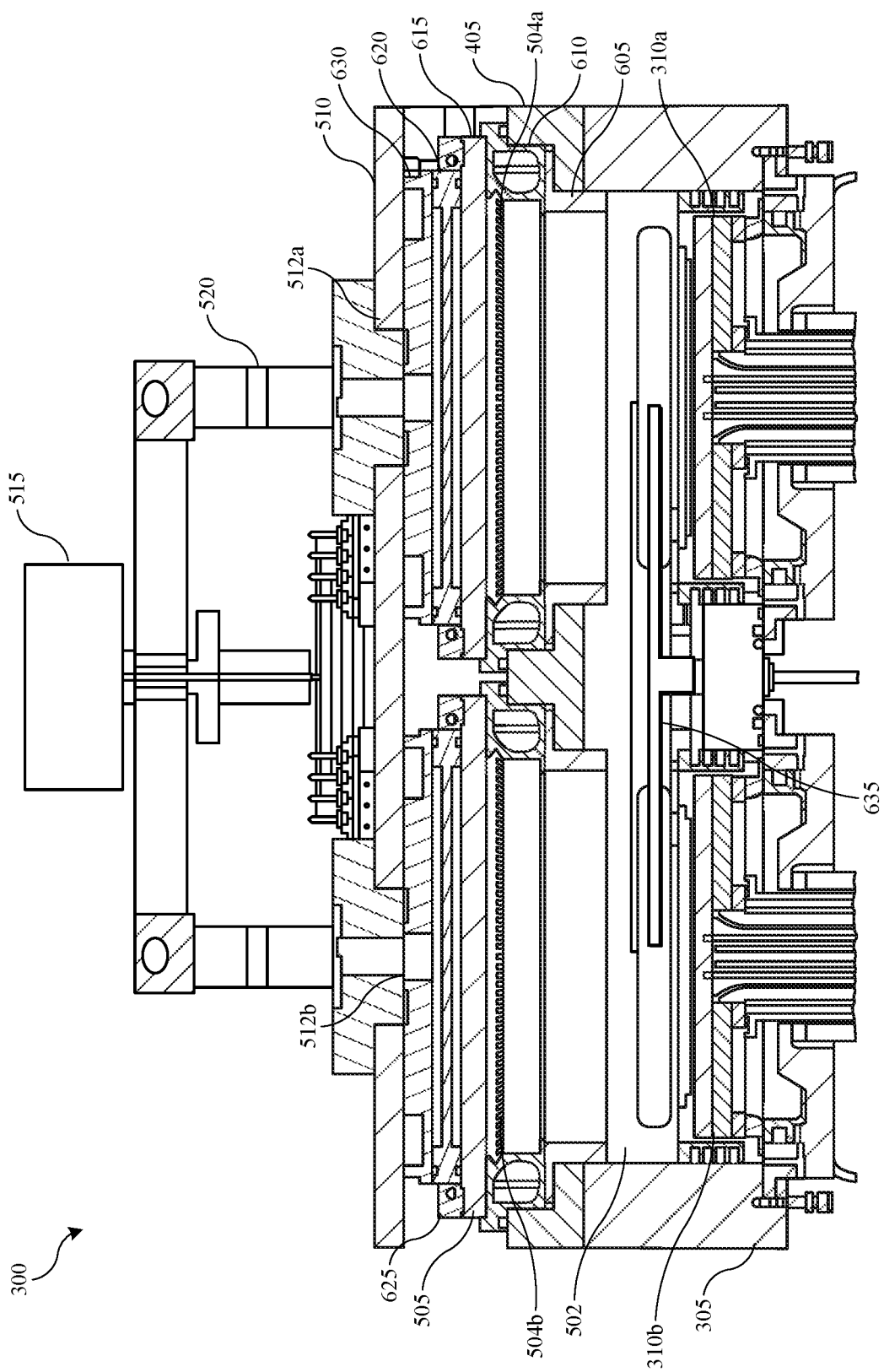
FIG. 6 shows a schematic partial cross-sectional view of an exemplary chamber system according to some embodiments of the present technology.

FIG. 6 shows a schematic cross-sectional elevation view of one embodiment of chamber system 300 according to some embodiments of the present technology. FIG. 6 may illustrate the cross-sectional view shown above in FIG. 5, and may further illustrate components of the system. The figure may include components of any of the systems illustrated and described previously, and may also show further aspects of any of the previously described systems. It is to be understood that the illustration may also show exemplary components as would be seen through any two adjacent processing regions 108 in any quad section 109 described above. The elevation view may illustrate the configuration or fluid coupling of one or more processing regions 504 with a transfer region 502. For example, a continuous transfer region 502 may be defined by chamber body 305. The housing may define an open interior volume in which a number of substrate supports 310 may be disposed. For example, as illustrated in FIG. 1, exemplary processing systems may include four or more, including a plurality of substrate supports 310 distributed within the chamber body about the transfer region. The substrate supports may be pedestals as illustrated, although a number of other configurations may also be used. In some embodiments the pedestals may be vertically translatable between the transfer region 502 and the processing regions 504 overlying the transfer region. The substrate supports may be vertically translatable along a central axis of the substrate support along a path between a first position and a second position within the chamber system. Accordingly, in some embodiments each substrate support 310 may be axially aligned with an overlying processing region 504 defined by one or more chamber components.

The open transfer region may afford the ability of a transfer apparatus 635, such as a carousel, to engage and move substrates, such as rotationally, between the various substrate supports. The transfer apparatus 635 may be rotatable about a central axis. This may allow substrates to be positioned for processing within any of the processing regions 504 within the processing system. The transfer apparatus 635 may include one or more end effectors that may engage substrates from above, below, or may engage exterior edges of the substrates for movement about the substrate supports. The transfer apparatus may receive substrates from a transfer chamber robot, such as robot 110 described previously. The transfer apparatus may then rotate substrates to alternate substrate supports to facilitate delivery of additional substrates.

Once positioned and awaiting processing, the transfer apparatus may position the end effectors or arms between substrate supports, which may allow the substrate supports to be raised past the transfer apparatus 635 and deliver the substrates into the processing regions 504, which may be vertically offset from the transfer region 502. For example, and as illustrated, substrate support 310a may deliver a substrate into processing region 504a, while substrate support 310b may deliver a substrate into processing region 504b. This may occur with the other two substrate supports and processing regions, as well as with additional substrate supports and processing regions in embodiments for which additional processing regions are included. In this configuration, the substrate supports may at least partially define a processing region 504 from below when operationally engaged for processing substrates, such as in the second position, and the processing regions may be axially aligned with an associated substrate support. The processing regions may be defined from above by the components of the lid stacks 505, which may each include one or more of the illustrated components. In some embodiments, each processing region may have individual lid stack components, although in some embodiments components may accommodate multiple processing regions 504. Based on this configuration, in some embodiments each processing region 504 may be fluidly coupled with the transfer region, while being fluidly isolated from above from each other processing region within the chamber system or quad section.

The lid stack 505 may include a number of components, which may facilitate flow of precursors through the chamber system, and may be at least partially contained between the first lid plate 405 and the second lid plate 510. A liner 605 may be seated directly on the shelf formed by each recessed ledge in first lid plate 405. For example, liner 605 may define a lip or flange, which may allow liner 605 to extend from the shelf of first lid plate 405. Liner 605 may extend vertically below the first surface of first lid plate 405 in some embodiments, and may at least partially extend into the open transfer region 502. The liner 605 may be made of materials similar or different from the chamber body materials, and may be or include materials that limit deposition or retention of materials on the surface of liner 605. Liner 605 may define an access diameter for substrate support 310, and may be characterized by any of the gap amounts described above for clearance between the substrate support 310 and the liner 605 when included.

Seated on the liner 605 may be a pumping liner 610, which may at least partially extend within the recess or along the recessed ledge defined in the second surface of first lid plate 405. In some embodiments, pumping liner 610 may be seated on liner 605 on the shelf formed by the recessed ledge. Pumping liner 610 may be an annular component, and may at least partially define the processing region 504 radially, or laterally depending on the volume geometry. The pumping liner may define an exhaust plenum within the liner, which may define a plurality of apertures on an inner annular surface of the pumping liner providing access to the exhaust plenum. The exhaust plenum may at least partially extend vertically above a height of the first lid plate 405, which may facilitate delivering exhausted materials through an exhaust channel formed through the first lid plate and chamber body as previously described. A portion of the pumping liner may at least partially extend across the second surface of the first lid plate 405 to complete the exhaust channel between the exhaust plenum of the pumping liner, and the channel formed through the chamber body and first lid plate.

A faceplate 615 may be seated on the pumping liner 610, and may define a plurality of apertures through the faceplate 615 for delivering precursors into the processing region 504. Faceplate 615 may at least partially define an associated processing region 504 from above, which may at least partially cooperate with the pumping liner and substrate support in a raised position to generally define the processing region. Faceplate 615 may operate as an electrode of the system for producing a local plasma within the processing region 504, and thus in some embodiments, faceplate 615 may be coupled with an electrical source or may be grounded. In some embodiments the substrate support 310 may operate as the companion electrode for generating a capacitively-coupled plasma between the faceplate and the substrate support.

A blocker plate 620 may be seated on the faceplate 615, which may further distribute processing fluids or precursors to produce a more uniform flow distribution to a substrate. Blocker plate 620 may also define a number of apertures through the plate. In some embodiments the blocker plate 620 may be characterized by a diameter less than a diameter of the faceplate as illustrated, which may provide an annular access on the surface of the faceplate radially outward from the blocker plate 620. In some embodiments a faceplate heater 625 may be seated on the annular access, and may contact faceplate 615 to heat the component during processing or other operations. In some embodiments, blocker plate 620 and faceplate heater 625 may be characterized together as having an outer radial diameter equal to or substantially equal to an outer radial diameter of faceplate 615. Similarly, faceplate heater 625 may be characterized as having an outer radial diameter equal to or substantially equal to an outer radial diameter of faceplate 615 in some embodiments. Faceplate heater 625 may extend about blocker plate 620, and may or may not directly contact blocker plate 620 on an outer radial edge of the blocker plate 620.

A gas box 630 may be positioned above the blocker plate 620, and the gas box 630 of each of the lid stacks 505 may at least partially support the second lid plate 510. Gas box 630 may define a central aperture that is aligned with an associated aperture 512 of the plurality of apertures defined through second lid plate 510. Second lid plate 510 may support a remote plasma unit 515 in some embodiments, which may include piping to each of the apertures 512, and into each processing region 504. Adapters may be positioned through apertures 512 to couple the remote plasma unit piping to the gas boxes 630. Additionally, isolation valves 520 may be positioned within the piping to meter flow to each individual processing region 504 in some embodiments.

O-rings or gaskets may be seated between each component of the lid stack 505, which may facilitate vacuum processing within chamber system 300 in some embodiments. The specific component coupling between the first lid plate 405 and the second lid plate 510 may occur in any number of ways, which may facilitate accessing system components. For example, a first set of couplings may be incorporated between the first lid plate 405 and the second lid plate 510, which may facilitate removal of both lid plates and each lid stack 505, which may provide access to the substrate supports or transfer apparatus within the transfer region of the chamber system. These couplings may include any number of physical and removable couplings extending between the two lid plates, which may allow them to be separated from the chamber body 405 as a whole. For example, a drive motor on a mainframe containing the chamber system 300 may be removably coupled with the second lid plate 510, which may lift the components away from the chamber body 305.

When the couplings between the first lid plate 405 and second lid plate 510 are disengaged, second lid plate 510 may be removed while first lid plate 405 may remain on chamber body 305, which may facilitate access to one or more components of the lid stacks 505. The break within the lid stack 505 may occur between any two components described previously, some of which may be coupled with first lid plate 405, and some of which may be coupled with second lid plate 510. For example, in some embodiments each of the gas boxes 630 may be coupled with second lid plate 510. Thus, when the second lid plate is lifted from the chamber system, the gas boxes may be removed, providing access to the blocker plate and faceplate. Continuing this example, the blocker plate 620 and faceplate 615 may or may not be coupled with the first lid plate 405. For example, although mechanical coupling may be included, the components may be decoupled and sit floating on the first lid plate 405, such as with locating features maintaining proper alignment of the components. It is to be understood that the example is intended to be non-limiting, and illustrative of any number of break configurations between any two components of the lid stack when the second lid plate 510 is separated from the first lid plate 405. Consequently, depending on the coupling between the first lid plate and second lid plate, the entire lid stack and both lid plates may be removed providing access to the transfer region, or the second lid plate may be removed providing access to the lid stack components.

Figure 7A:
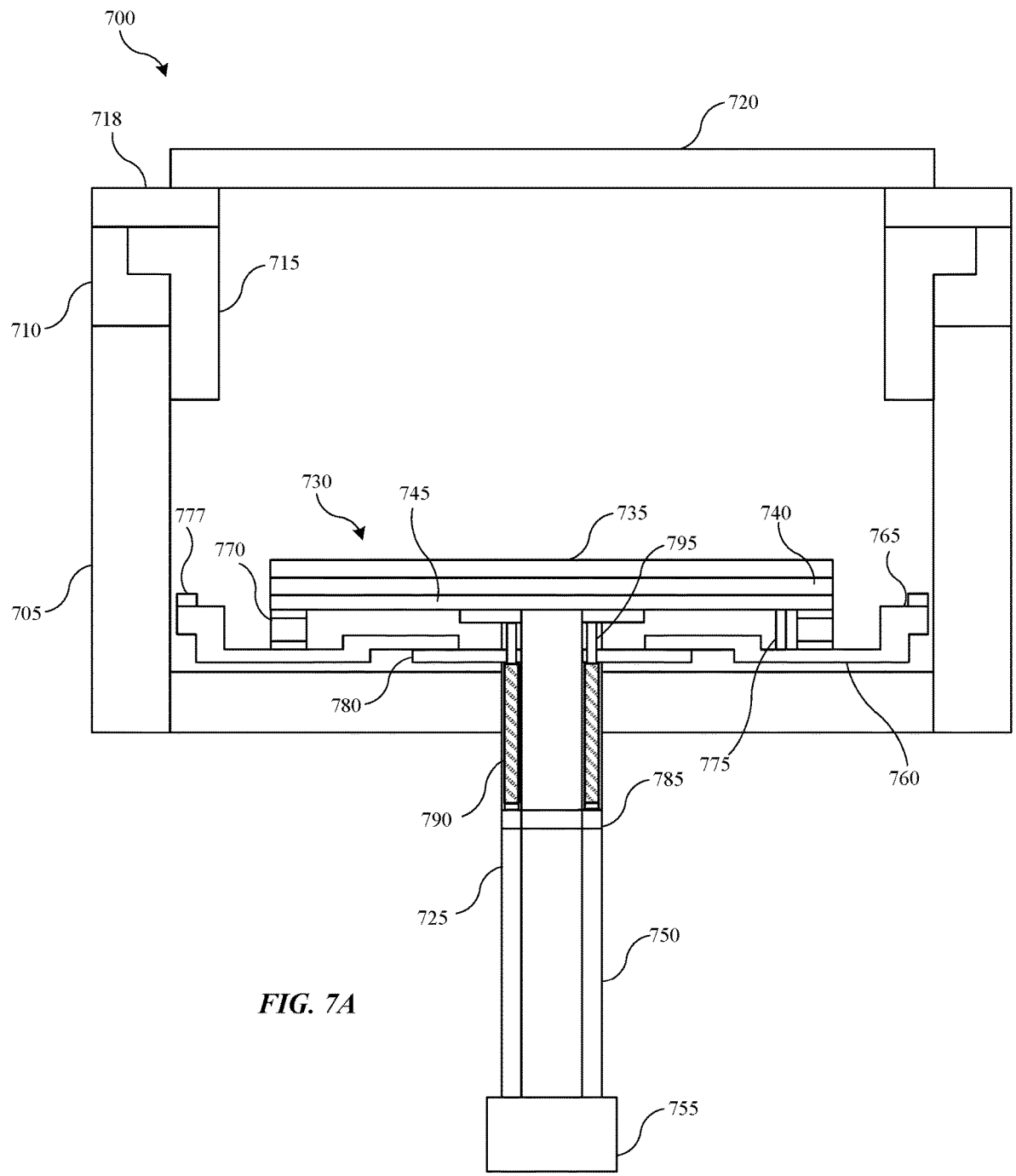
FIGS. 7A-7C show schematic partial cross-sectional views of an exemplary chamber system according to some embodiments of the present technology.
Figure 7B:
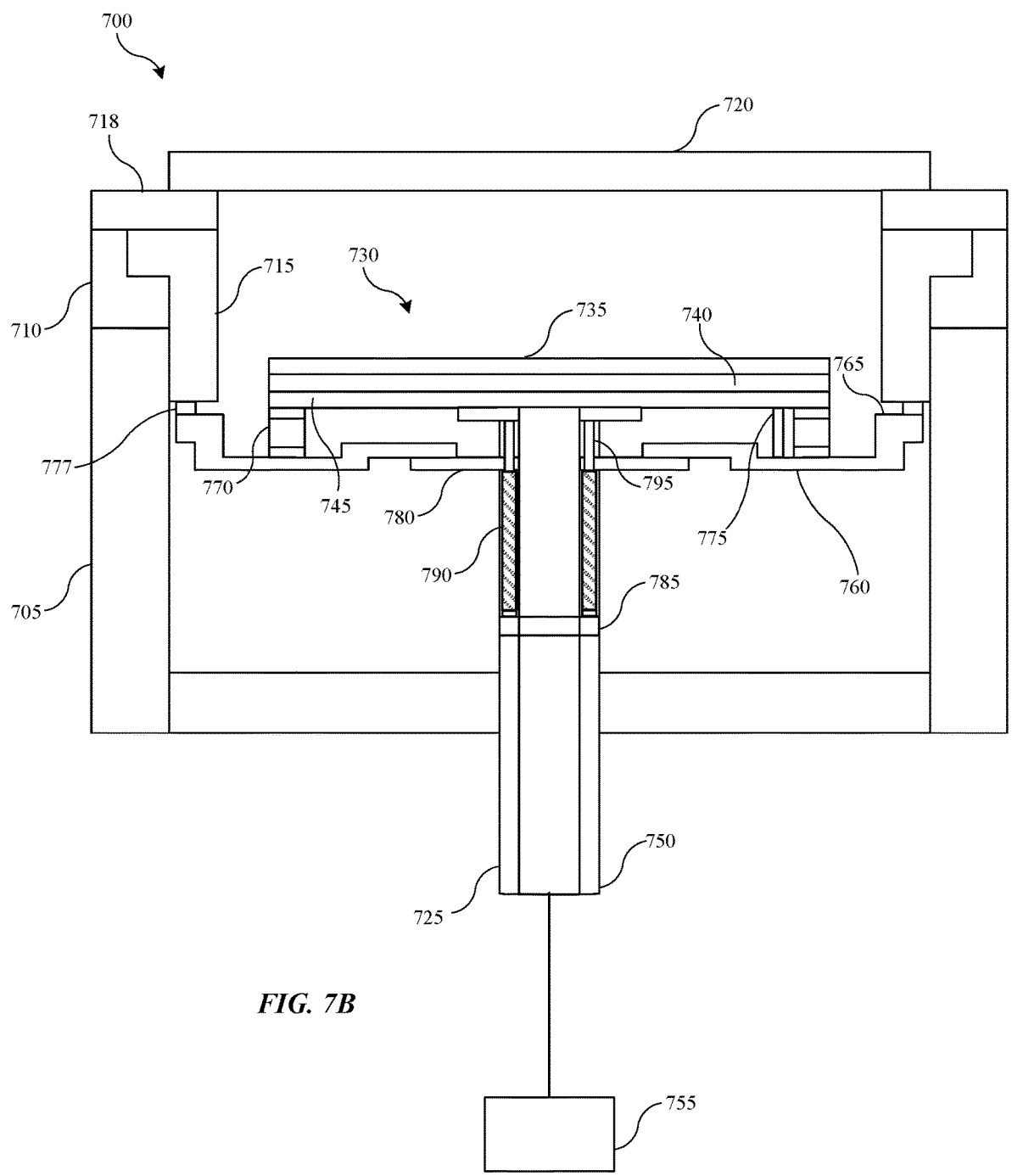
Figure 7C:
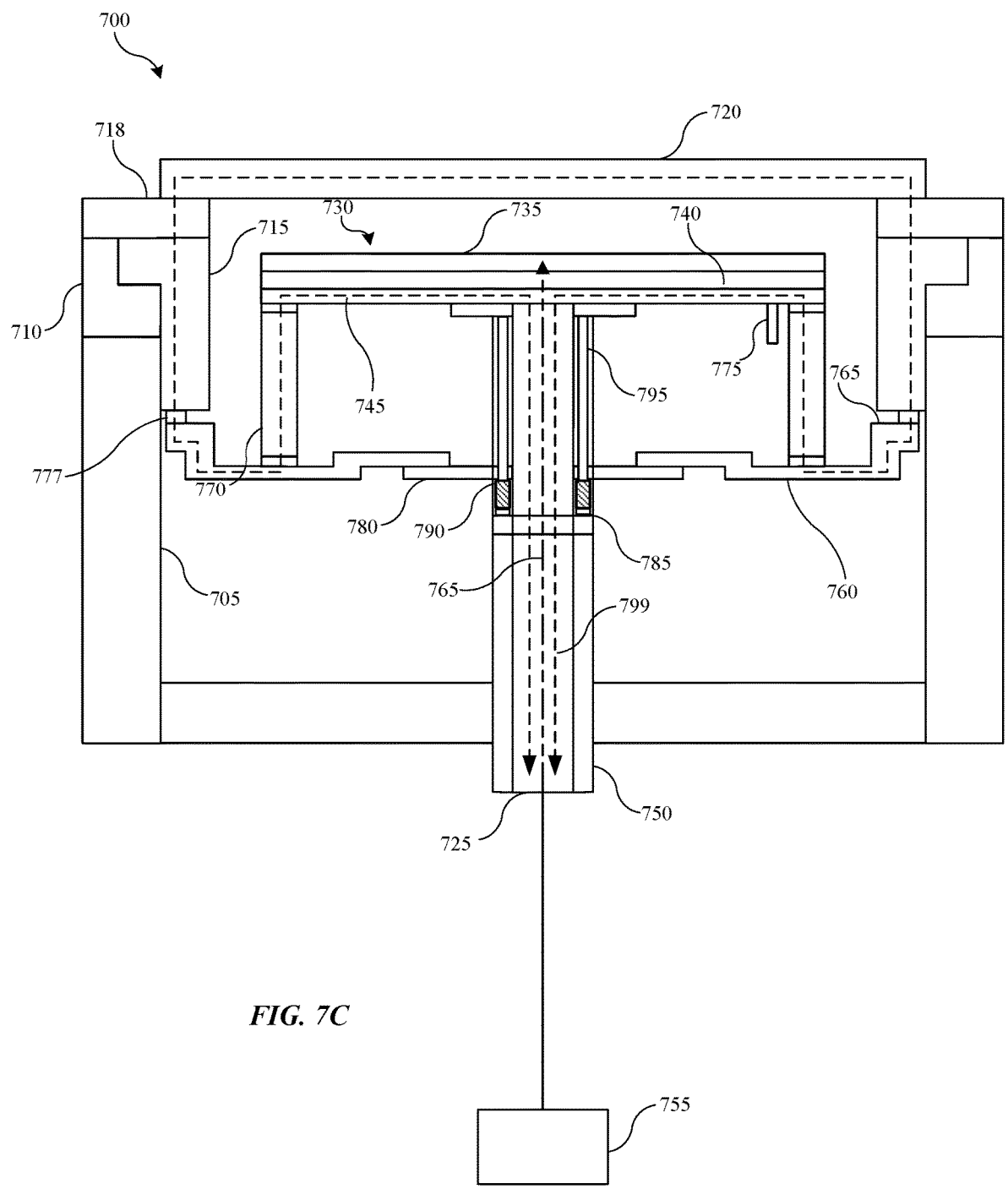

FIGS. 7A-7C show schematic cross-sectional side elevation views of an exemplary processing chamber system 700 according to some embodiments of the present technology. FIGS. 7A and 7B may illustrate further details relating to components in systems 100, 200, and 300. System 700 is understood to include any feature or aspect of systems 100, 200, and/or 300 discussed previously in some embodiments. The system 700 may be used to perform semiconductor processing operations, such as deposition, removal, and cleaning operations. System 700 may show a partial view of the chamber components being discussed and that may be incorporated in a semiconductor processing system. Any aspect of system 700 may also be incorporated with other processing chambers or systems as will be readily understood by the skilled artisan.

System 700 may include a chamber body 705 that may define a transfer region and a processing region. A lid plate 710 may be seated atop the chamber body 705 and may support a liner 715. For example, edges of the liner 715 may be seated directly on a shelf formed by a recessed ledge of lid plate 710. For example, liner 715 may define a lip or flange, which may allow liner 715 to extend from the shelf of lid plate 710. Liner 715 may extend vertically below the first lid plate 710 in some embodiments, and may at least partially extend into an interior of the chamber body 705. A faceplate 720 may be disposed atop the liner 715. In some embodiments, one or more intervening components, such as a pump liner 718, may be disposed between the faceplate 720 and the liner 715.

A substrate support 725 may be disposed within the interior of the chamber body 705. The substrate support 725 may be vertically translatable within the chamber body 705 between the transfer region and the processing region. The substrate support 725 may include a support plate 730, which may include a heater 735, an isolator 740, and a ground plate 745. The substrate support 725 may also include a shaft 750 that may extend through a bottom of the chamber body 705 and couple with a radio frequency source 755. The substrate support may also include a bowl 760 that is disposed about the shaft 750 and is vertically spaced from a bottom of the support plate 730. The bowl 760 may be generally annular in shape and may have a greater radius than the support plate 730 such that a peripheral edge 765 of the bowl 760 extends radially outward from a peripheral edge of the support plate 730. The peripheral edge 765 of the bowl 760 may be in vertical alignment with at least a portion of a bottom surface of the liner 715. For example, the peripheral edge 765 of the bowl 760 may extend substantially to an inner wall of the chamber 705 and may be in substantial alignment with the liner 715. The peripheral edge 765 of the bowl 760 may project upward from a primary surface of the bowl 760. For example, the peripheral edge 765 of the bowl 760 may include a lip that extends upward such that a top surface of the peripheral edge 765 may be alongside a portion of the support plate 730 and/or just below a bottom surface of the support plate 730 (such as just below the bottom surface of the ground plate 745. The top surface of the peripheral edge 765 of the bowl 760 may be maintained at a height that is less than a top surface of the support plate 730 to ensure that the peripheral edge 765 does not interfere with transfer operations. In some embodiments, the bowl 760 and/or heater 735 may be formed of a material that is resistant to a precursor, such as nitrogen trifluoride. For example, the bowl 760 and/or heater 735 may be formed from an aluminum material, such as aluminum nitride. In some embodiments, an RF gasket 777 may be positioned atop the top surface of the peripheral edge 765 of the bowl 760. The RF gasket 777 may help provide more consistent repeatability of an RF return path by ensuring proper contact between the bowl 760 and the liner 715 when the bowl 760 is elevated to bring the RF gasket 777 into contact with the liner 715.

A number of straps 770 may extend between and couple a top surface of the bowl 760 and a bottom surface of the support plate 730. For example, the straps 770 may be coupled with a bottom surface of the ground plate 745. The straps 770 may provide radio frequency continuity between the support plate 730 and the bowl 760. Each strap 770 may be formed from a thin, flexible sheet of metal or other conductive material that allows the strap 770 to repeatedly flex between a compressed or folded state and an extended state. For example, each strap 770 may be formed from stainless steel, aluminum, and/or other metallic material. In some embodiments, the straps 770 may be coated with a precursor-resistant material. For example, the straps 770 may be coated with an aluminum material, such as aluminum nitride. Straps 770 may be arranged in symmetrical or asymmetrical patterns about the support plate 730 and bowl 760. For example, the straps 770 may be in an annular arrangement that includes multiple straps 770. To provide a symmetrical radio frequency return path, two or more straps 770 may be included. For example, each of the support plate 730 and bowl 760 may include about 2 or more straps, about 3 or more straps, about 4 or more straps, about 5 or more straps, about 6 or more straps, about 7 or more straps, about 8 or more straps, about 9 or more straps, about 10 or more straps, about 12 or more straps, about 14 or more straps, about 16 or more straps, about 18 or more straps, about 20 or more straps, or more. In some embodiments, in addition to or in place of the straps 770, a flexible bellow may be positioned between the support plate 725 and the bowl 760 to maintain radio frequency continuity between the support plate 725 and the bowl 760. For example, the bellow may be compressed when the substrate support 725 is in a transfer position and may expand when the substrate support 725 is in a process position.

One or more hard stops 775 may extend downward from a bottom of the support plate 730. For example, the hard stops 775 may be formed as part of and/or coupled with the ground plate 745. The hard stops 775 may take various forms. As just one example, each hard stop 775 may be in the form of a rod or column that projects downward from the ground plate 745. A distal end of each hard stop 775 may contact a top surface of the bowl 760 and may prevent the bowl 760 from moving closer to the support plate 730. The hard stops 775 may also operate to push the bowl 760 downward when the substrate support 730 is translated downward within the chamber body 705. Hard stops 775 may be arranged in symmetrical asymmetrical patterns about the support plate 730. For example, the hard stops 775 may be in an annular arrangement that includes multiple hard stops 775. Any number of hard stops 775 may be included on the support plate 730. For example, the support plate 730 may include about 2 or more hard stops, about 3 or more hard stops, about 4 or more hard stops, about 5 or more hard stops, about 6 or more hard stops, about 7 or more hard stops, about 8 or more hard stops, about 9 or more hard stops, about 10 or more hard stops, about 12 or more hard stops, about 14 or more hard stops, about 16 or more hard stops, about 18 or more hard stops, about 20 or more hard stops, or more.

The bowl 760 may be coupled with the support plate 730 using a coupling that pushes the bowl 760 upward as the substrate support 725 is translated to the process position. The coupling may be expandable and contractible in a vertical direction to not only allow the coupling to push the bowl 760 upwards, but to also accommodate vertical movement of the support plate 730 relative to the bowl 760. This enables the bowl 760 and support plate 730 to be positioned close together to facilitate a transfer position in which the support plate 730 is positioned proximate a bottom of the chamber 705, while also enabling the support plate 730 to be translated sufficiently high to project above the bottom surface of the liner 715 when in the process position while the bowl 760 (or RF gasket 777) contacts the bottom surface of the liner 715. In some embodiments, the coupling may include a preload plate 780 that is coupled with the bowl 760. For example, the preload plate 780 may be coupled with an inner region of the bowl 760 and may be slidably engaged about the shaft 750. In some embodiments, rather than being separate components, the bowl 760 and preload plate 780 may be a single unit. The coupling may also include a bottom ring 785 that is spaced vertically below the preload plate 780. The bottom ring 785 may be coupled with the shaft 750 at a fixed location. A number of springs 790 may be coupled with and extend between the preload plate 780 and the bottom ring 785. Such positioning of the springs 790 enables the springs 790 to be proximate a cooling hub that may be positioned beneath the chamber body 705 that cools the springs 790 in between processing operations. Each spring 790 may be mounted on a guide pin 795, with the body of the guide pin 795 being received within an interior of the spring 790. Each of the guide pins 795 may extend between the support plate 730 and the bottom ring 785. For example, a top surface of each guide pin 795 may be freely positioned (uncoupled) below the underside of the ground plate 745, while a bottom end of each guide pin 795 may be coupled with a top surface of the bottom ring 785. Medial portions of each guide pin 795 may extend through apertures formed in the preload plate 780. The apertures may be sized to slidingly receive the guide pins 795, while being smaller than an outer diameter of the springs 790, thereby enabling the bottom surface of the preload plate 780 to constrain vertical movement of the spring 790. The springs 790 may be mounted on the guide pins 795 with a top end of the spring 790 positioned proximate or against the bottom surface of the preload plate 780, while the bottom end of the spring 790 is supported by the top surface of the bottom ring 785 and/or an enlarged bottom end of the guide pin 795. For example, a bottom end of each guide pin 795 may include a flange, shoulder, and/or other region that has a greater diameter than a main body of the guide pin 795. The bottom end of the spring 790 may be supported by a top surface of the flange. With the bottom of each spring 790 positioned against the fixed bottom ring 785, the springs 790 may press against a bottom of the preload plate 780 to prevent the preload plate 780 and bowl 760 from sliding downward along the shaft 750 until a net upward force is applied to the substrate support 725 that exceeds a cumulative spring force of the springs 790.

As described above, the substrate support 725 is translatable within the chamber body 705 between the a lower transfer region and an upper processing region. During a processing operation, the substrate support 725 is moved into a process position within the processing region. A radio frequency current may be flowed to the heater 735 to help maintain a substrate at a desired temperature to aid in generating uniform film deposition on the substrate. Once deposition and/or other processing operations are complete, the substrate support 725 may be lowered to a transfer position within the transfer region. The processed substrate may be removed from the substrate support 725 and a new substrate may be positioned atop the substrate support 725. During a transfer process, no radio frequency current is supplied to the heater 735.

The various features of chamber system 700 may create a closed radio frequency circuit that enables radio frequency current to flow from the radio frequency source 755 to the heater 735 and to return to the radio frequency source 755 to the heater 735 when the substrate support 725 is in the process position, while opening the circuit and preventing radio frequency current to flow when the substrate support 725 is in the transfer position. FIG. 7A illustrates the substrate support 725 in the transfer position, with the support plate 730 being proximate a bottom of the chamber body 705. In the transfer position, the bowl 760 may be positioned at a fixed distance relative to the support plate 730. In some embodiments, the fixed distance may be maintained by the force of the springs 790 pressing upward on the preload plate 780 until the top surface of the bowl 760 contacts the hard stops 775. In such embodiments, the springs 790 may be slightly compressed while the substrate support 725 is in the transfer position. When the bowl 760 and support plate 730 are spaced apart by the fixed distance, the straps 770 may be in a relaxed or otherwise contracted state. The top surface of the peripheral edge 765 of the bowl 760 may be spaced apart from the bottom surface of the liner 715, thereby opening a radio frequency circuit to prevent radio frequency current flow through the heater 735 when in the transfer position.

The substrate support 725 may be raised upward into the processing region toward a processing position. The bottom ring 785 may be raised as substrate support 725 is translated upward. As the bottom ring 785 is raised, the partially compressed springs 790 press against the bottom of the purge plate 780, thereby lifting the purge plate 780 and bowl 760 until the top surface of the peripheral edge 765 of the bowl 760 (or RF gasket 777) contacts the bottom surface of the liner 715 as shown in FIG. 7B. The contact between the bottom surface of the liner 715 and the top surface of the peripheral edge 765 (or RF gasket 777) serves as a hard stop that prevents the bowl 760 from moving further upward while the support plate 730 continues to elevate toward the process position. The support plate 730 may be further elevated using a force that exceeds a cumulative spring force of the springs 790, causing the springs 790 to become further compressed as a distance between the bottom ring 785 and the bowl 760 decreases. A distance between the support plate 730 and the bowl 760 increases, causing the straps 770 to extend until the substrate support 725 and support plate 730 reach the process position as shown in FIG. 7C.

The contact between the top surface of the peripheral edge 765 of the bowl 760 (or RF gasket 777) and the bottom surface of the liner 715 provides radio frequency continuity between the liner 715 and the bowl 760. In this process position, a closed radio frequency circuit is provided that allows radio frequency current to flow from the radio frequency source 755 to the heater 730 as shown by arrow 797 and enables return current to flow back to the radio frequency source 755 as shown by arrows 799. For example, the closed radio frequency circuit may be formed by the radio frequency source 755, substrate support 725 (including the bowl 760, RF gasket 777 (if present), support plate 730, shaft 750, and straps 770), the liner 715, and the faceplate 720. It will be appreciated that the radio frequency circuit may also include other components, such as components between the liner 715 and faceplate (such as pump liner 718 and/or lid plate 710), as well as plasma formed between the heater 735 and the faceplate 720.

After one or more processing operations are performed, the substrate support 725 may be translated downward to the transfer position, allowing a processed substrate to be unloaded from the support plate 730 and a next substrate to be loaded on the support plate 730. As the substrate support 725 (including bottom ring 785) is lowered, the distance between the bottom ring 785 and the bowl 760 increases, enabling the springs 790 to expand. Additionally, the distance between the support plate 730 and the bowl 760 decreases, causing the straps 770 to contract or relax. The downward movement of the support plate 730 causes the bottom surfaces of the hard stops 775 to contact the top surface of the bowl 760 and force the bowl 760 to move downward out of engagement with the liner 715, thereby opening the radio frequency circuit.

The use of a translatable bowl 760 and straps 770 to create a dynamic radio frequency interface as described herein creates a closed radio frequency circuit when the substrate support is in the process position and opens the circuit when in the transfer position. Additionally, the use of bowl 760 reduces the area of a contact interface between components that dynamically contact one another than in conventional designs, which reduces the generation of particles from previous processing operations and results in substrates of higher quality. Additionally, the use of bowl 760 rather than a baffle-oriented design significantly reduces the weight of the chamber and enables the components of the radio frequency circuit to be more easily serviced by a single technician.

Figure 8:
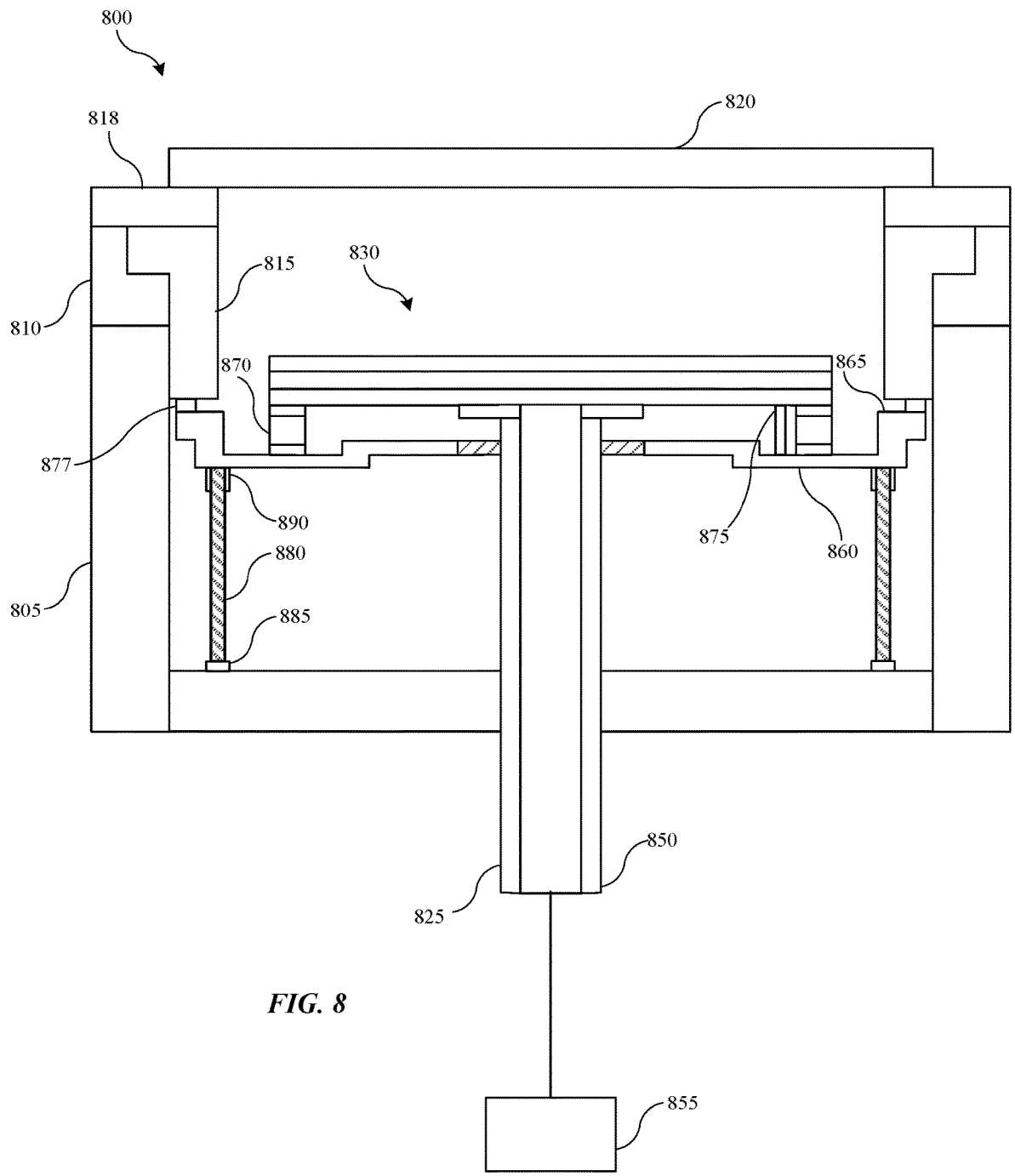
FIG. 8 shows a schematic partial cross-sectional view of an exemplary chamber system according to some embodiments of the present technology.

FIG. 8 shows a schematic cross-sectional side elevation view of an exemplary processing chamber system 800 according to some embodiments of the present technology. FIG. 8 may illustrate further details relating to components in systems 100, 200, 300, and 700. System 800 is understood to include any feature or aspect of systems 100, 200, 300, and/or 700 discussed previously in some embodiments. The system 800 may be used to perform semiconductor processing operations, such as deposition, removal, and cleaning operations. System 800 may show a partial view of the chamber components being discussed and that may be incorporated in a semiconductor processing system. Any aspect of system 800 may also be incorporated with other processing chambers or systems as will be readily understood by the skilled artisan.

System 800 may include a chamber body 805 that may define a transfer region and a processing region. A lid plate 810 may be seated atop the chamber body 805 and may support a liner 815. A faceplate 820 may be disposed atop the liner 815. In some embodiments, one or more intervening components, such as a pump liner 818, may be disposed between the faceplate 820 and the liner 815. A substrate support 825 may be disposed within the interior of the chamber body 805 and may include a support plate 830. The substrate support 825 may be vertically translatable within the chamber body 805 between the transfer region and the processing region and may include a shaft 850 that may extend through a bottom of the chamber body 805 and couple with a radio frequency source 855. The substrate support may also include a bowl 860 that is disposed about the shaft 850 and is vertically spaced from a bottom of the support plate 830. The bowl 860 may be generally annular in shape and may have a greater radius than the support plate 830 such that a peripheral edge 865 of the bowl 860 extends radially outward from a peripheral edge of the support plate 830 and is in vertical alignment with at least a portion of a bottom surface of the liner 815. In some embodiments, an RF gasket 877 may be positioned atop the top surface of the peripheral edge 865 of the bowl 860. The RF gasket 877 may help provide more consistent repeatability of an RF return path by ensuring proper contact between the bowl 860 and the liner 815 when the bowl 860 is elevated to bring the RF gasket 877 into contact with the liner 815. A number of straps 870 may extend between and couple a top surface of the bowl 860 and a bottom surface of the support plate 830. In some embodiments, in addition to or in place of the straps 870, a flexible bellow may be positioned between the support plate 825 and the bowl 860 to maintain radio frequency continuity between the support plate 825 and the bowl 860. One or more hard stops 875 may extend downward from a bottom of the support plate 830.

System 800 may include one or more springs 880 that may be positioned between a bottom surface of the bowl 860 and a top surface of the bottom of the chamber body 805. For example, each spring 880 may be positioned on a corresponding guide pin 885 that extends between the bottom surface of the bowl 860 and a top surface of the bottom of the chamber body 805. In some embodiments, a top end of each spring 880 may be positioned within or under an isolator 890 that may isolate the spring 880 from RF current and ensure that the RF circuit extends back through the substrate support 825, rather than down through the spring 880. Each spring 880 may provide spring force that pushes upward against the bottom surface of the bowl 860. When the substrate support 825 is being lowered and/or in the transfer position, the hard stops 875 may provide downward force on the bowl 860 that is greater than the spring force, which causes the bowl 860 to lower and the springs 880 to further compress. As the substrate support 825 is translated upward, the springs 880 may begin to extend and push the bowl 860 upwards, with the hard stops 875 preventing the bowl 860 from contacting the support plate 830. The springs 880 may provide sufficient force to raise the bowl 860 to a height in which the bowl 860 and/or RF gasket 877 is in contact with a bottom surface of the liner 815 to complete an RF circuit as previously described.

Figure 9:
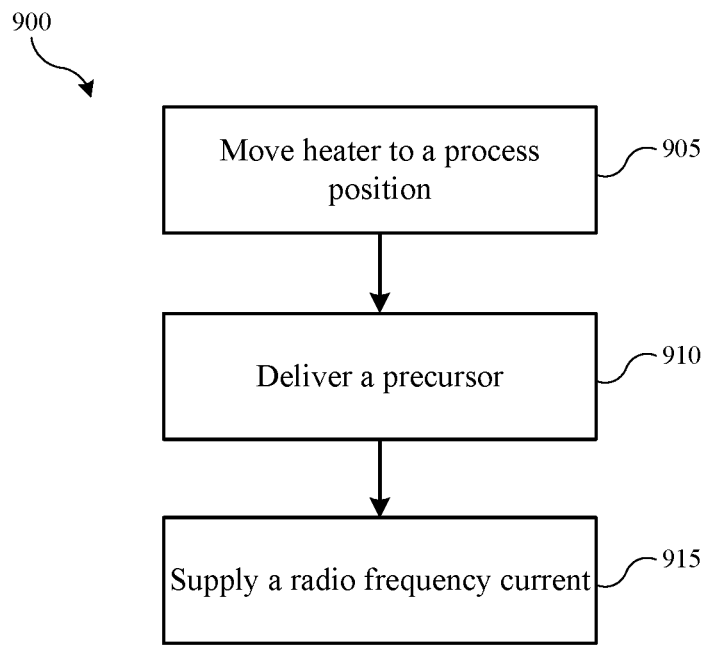
FIG. 9 shows operations of an exemplary method of processing a substrate according to some embodiments of the present technology.

FIG. 9 shows operations of an exemplary method 900 of substrate processing according to some embodiments of the present technology. The method may be performed in a variety of processing chambers, including processing system 100, 200, 300, 700, and 800 described above, which may include dynamic radio frequency circuits according to embodiments of the present technology. Method 900 may include a number of optional operations, which may or may not be specifically associated with some embodiments of methods according to the present technology.

Method 900 may include a method that may include optional operations prior to initiation of method 900, or the method may include additional operations. For example, method 900 may include operations performed in different orders than illustrated. In some embodiments, method 900 may include moving a substrate support upward within a semiconductor processing chamber from a transfer position to a process position to engage a bowl of the substrate support with a liner of the semiconductor processing chamber to close a radio frequency circuit at operation 905. For example, the bowl may be movably coupled with the substrate support. As the substrate support is raised, the bowl may be drawn upward until peripheral edges of the bowl contact a liner of the semiconductor processing chamber. The contact between the bowl and the liner provides radio frequency continuity between the liner and the bowl and closes a radio frequency circuit of the processing chamber, as well as serves as a hard stop that prevents the bowl from moving further upward. As the substrate support moves further upward to the process position, a number of straps extend between the support plate and the bowl and maintain electrical continuity between the bowl and the support plate.

At operation 910, one or more precursors, such as (but not limited to) a silicon-containing precursor, may be delivered to the semiconductor processing chamber. A radio frequency current may be supplied to the faceplate, the heater, or some other component via a radio frequency source at operation 915. For example, the radio frequency may be used to generate a capacitively-coupled plasma between the faceplate and the heater to perform a deposition operation within the processing region of the chamber. The contact between the bowl and the liner may produce a symmetrical ground path to operate as a radio frequency return through the pedestal. By utilizing an annular arrangement of components that form the radio frequency path, plasma uniformity may be maintained by producing the symmetrical ground path through the bowl and flexible straps, while accommodating separation of the support plate from the bowl during translation of the pedestal within the system.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a heater" includes a plurality of such heaters, and reference to "the aperture" includes reference to one or more apertures and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

What is claimed is:

1. A substrate processing system, comprising:
a chamber body that defines a processing region and a transfer region;
a lid plate seated on the chamber body;
a liner positioned atop the lid plate;
a faceplate that is positioned atop the liner;
a substrate support disposed within the chamber body, the substrate support being vertically translatable within the chamber body between a process position and a transfer position, wherein the substrate support comprises:
a support plate comprising a heater;
a shaft that is coupled with a bottom of the support plate;
a bowl disposed about the shaft and spaced a distance below the support plate, wherein a peripheral edge of the bowl is in vertical alignment with at least a portion of a bottom surface of the liner;
a plurality of springs that push the bowl upward as the substrate support is translated to the process position;
a plurality of metallic straps that couple the bottom of the support plate with the bowl, and at least one hard stop extending downward from the bottom of the support plate, wherein:

a top surface of the peripheral edge of the bowl contacts the bottom surface of the liner when the substrate support is in the process position; and the top surface of the peripheral edge of the bowl is spaced apart from the bottom surface of the liner and a distal end of the at least one hard stop contacts the bowl when the substrate support is in the transfer position; and a radio frequency source coupled with the substrate support, wherein in the process position, a closed radio frequency circuit is formed between the radio frequency source, the substrate support, the plurality metallic of straps, the liner, and the faceplate.

2. The substrate processing system of claim 1, further comprising:

a preload plate coupled with the bowl and slidably engaged about the shaft; and a bottom ring spaced vertically below the preload plate, wherein the plurality of springs are coupled with and extend between the preload plate and the bottom ring.

3. The substrate processing system of claim 2, wherein:

each of the plurality of springs is in a compressed state when the substrate support is in the process position; and each of the plurality of springs is in a generally relaxed state when the substrate support is in the transfer position.

4. The substrate processing system of claim 2, wherein:

each of the plurality of springs is positioned about a respective one of a plurality of guide pins.

5. The substrate processing system of claim 1, wherein:

the at least one hard stop limits a vertical distance between the support plate and the bowl.

6. The substrate processing system of claim 5, wherein:

the at least one hard stop pushes the bowl downward as the substrate support is translated downward to the transfer position.

7. The substrate processing system of claim 1, further comprising:

a pump liner disposed between the faceplate and the liner.

8. The substrate processing system of claim 1, wherein:

each of the plurality of metallic straps is in a contracted state when the substrate support is in the transfer position; and each of the plurality of metallic straps is in an extended state when the substrate support is in the process position.

9. A substrate processing system, comprising:

a chamber body that defines a processing region and a transfer region;

a lid plate seated on the chamber body;

a liner positioned atop the lid plate;

a faceplate that is positioned atop the liner;

a substrate support disposed within the chamber body, the substrate support being vertically translatable within the chamber body between a process position and a transfer position, wherein the substrate support comprises:

a support plate comprising a heater;

a shaft that is coupled with a bottom of the support plate;

a bowl disposed about the shaft and spaced a distance below the support plate;

a plurality of metallic straps that couple the bottom of the support plate with the bowl;

a hard stop coupled with the support plate that pushes the bowl downward as the substrate support is translated to the transfer position; and a coupling that pushes the bowl upward as the substrate support is translated to the process position, wherein:

the bowl contacts a bottom surface of the liner when the substrate support is in the process position; and the bowl is spaced apart from the bottom surface of the liner and a distal end of the at least one hard stop contacts the bowl when the substrate support is in the transfer position; and a radio frequency source coupled with the substrate support, wherein in the process position, a closed radio frequency circuit is formed between the radio frequency source, the substrate support, the plurality of metallic straps, the liner, and the faceplate.

10. The substrate processing system of claim 9, wherein:

the coupling is expandable and contractible in a vertical direction.

11. The substrate processing system of claim 9, wherein:

the coupling comprises:

a preload plate coupled with the bowl and slidably engaged about the shaft;

a bottom ring spaced vertically below the preload plate; and a plurality of springs coupled with and extending between the preload plate and the bottom ring.

12. The substrate processing system of claim 9, wherein:

each of the plurality of springs is in a compressed state when the substrate support is in the process position; and each of the plurality of springs is in a generally relaxed state when the substrate support is in the transfer position.

13. The substrate processing system of claim 12, wherein:

each of the plurality of springs is positioned about a respective one of a plurality of guide pins.

14. The substrate processing system of claim 9, wherein:

the hard stop limits a vertical distance between the support plate and the bowl.

15. The substrate processing system of claim 9, further comprising:

a pump liner disposed between the faceplate and the liner.

\* \* \* \* \*